United States Patent [19]
Kusakabe

[11] Patent Number: 5,656,831
[45] Date of Patent: Aug. 12, 1997

[54] SEMICONDUCTOR PHOTO DETECTOR

[75] Inventor: Atsuhiko Kusakabe, Tokyo, Japan

[73] Assignee: NEC Corporation, Tokyo, Japan

[21] Appl. No.: 625,364

[22] Filed: Apr. 1, 1996

[30] Foreign Application Priority Data

Mar. 31, 1995 [JP] Japan .................................. 7-75126

[51] Int. Cl.$^6$ .................. H01L 31/0328; H01L 31/0336; H01L 31/072; H01L 31/109
[52] U.S. Cl. ............................ 257/186; 257/486; 257/15; 257/17
[58] Field of Search .................... 257/15, 17, 438

Primary Examiner—Sara W. Crane
Assistant Examiner—Douglas A. Wille
Attorney, Agent, or Firm—Young & Thompson

[57] ABSTRACT

A semiconductor photo detector has its construction such that on a substrate made of InP are formed light absorption layer having a supperlattice structure made of n– type InGaAsP and InAsP, an intermediate layer made of n– type InGaAs, a multiplication layer made of n– type InP and a layer made of p– type layer. The light having a wavelength 1.65 μm being made incident into the detector from the p– type InP layer is absorbed in the superlattice structure light absorption layer of n– type InGaAs/InAsP and changed into carriers, which flowed out an external circuit. Since the superlattice of InGaAs and InAsP makes a lattice matching to InP, it may be possible to prevent that a dark current is generated by a lattice mismatching. The carriers generated by the absorbed light in the light absorption layer pass from the p type side electrode 11 into an external circuit via the n type InGaAsP intermediate layer 4, n+ type InP multiplication layer 5 and p+ type InP layer 8.

6 Claims, 3 Drawing Sheets

SEMICONDUCTOR PHOTO DETECTOR

BACKGROUND OF THE INVENTION

1) Field of the Invention

The present invention relates to a semiconductor photo detector for use in optical measurements or optical communications.

2) Related Art

Currently, optical fibers are widely used in cables of optical communications; in order to maintain and manage such optical fiber networks, an optical time domain reflectometory method (hereinafter referred to as "OTDR"), is used for finding out damage of the optical fibers. The basic principle thereof is: a pulse of light is made incident into the optical fiber and is transmitted therethrough whereby a Rayleigh scattered light is generated; any damage of the optical fiber can be found out by monitoring the thus generated Rayleigh scattered light. That is to say, if the optical fiber has some damage, the Rayleigh scattered light might not be returned to the monitoring point, so that the point of damage on the optical fiber can be correctly obtained by converting the time period from when the monitoring starts until the time when the Rayleigh scattered light cannot be monitored into a distance.

In such a system, it is necessary to connect the light communication line to the OTDR, and therefore, the communication line is temporarily interrupted. In order to solve this drawback, it is considered to conduct monitoring at all times while using the light communication line as it is. In this case, the monitoring is conducted by using light having a wave length of 1.65 µm, which is different from the wavelength of transmission light used in the light communications, i.e. 1.3 µm or 1.55 µm.

An Avalanche Photo Diode (hereinafter referred to as "APD") is used as a semiconductor photo detector for use in such a monitoring system. Since the APD per as has its own amplifying function, it is generally used as a photo detector having a high reliability in the fields of optical measurements or optical communications. Particularly, InP/InGaAs are widely used as materials in semiconductor photo detectors for use in long distance and large capacity optical communication systems, where light having a wavelength of 1.3 µm or 1.55 µm is used.

FIG. 1 is a cross sectional view showing a construction of the conventional type of APD in which InP/InGaAs is used as light absorption layer. As shown in FIG. 1, the APD has its construction such that on a substrate 1, which is made of n+ type InP, an epitaxial crystal layer is formed, where a buffer layer 2 made of n type InP having a carrier concentration of 1E14 to 1E16 $cm^{-3}$ and a thickness of 1 to 3 µm, a light absorption layer 15 made of n− type $In_{0.53}Ga_{0.47}As$ having a carrier concentration of 1E14 to 1E16 $cm^{-3}$ and a thickness of 1 to 5µm, an intermediate layer 4 made of n type InGaAS having a carrier concentration of 1E15 to 1E16 $cm^{-3}$ and a thickness of 0.3 to 1 µm, and a multiplication layer 5 made of n+ type InP having a carrier concentration 2E16 to 4E16 $cm^{-3}$ and a thickness of 0.8 to 4 µm are subsequently formed in this order by using a gas phase crystal growth method. On the epitaxial layer, a light receiving portion 8 made of p+ type InP layer having its carrier concentration of 1E17 to 1E20 $cm^{-3}$ is selectively formed by a diffusion of Zn in a closed tube, and a guard ring 7 is further provided so as to surround the light receiving portion 8 by an ion implantation of Be.

When a reverse bias is applied to the InGaAs APD, a depletion layer is generated in the InGaAs light absorption layer 15. In case that light having a wave length of 1.3 µm, which is less than a wave length of 1.67 µm, corresponding to a band gap energy of the InGaAs light absorption layer 15, is made incident into the APD, carriers are generated in the depletion layer of the light absorption layer 15 by a photoelectric effect. The thus generated carriers are accelerated by an internal electric field of 20 to 100 kV/cm in the depletion layer to its saturated velocity, so that the carriers go out to an external circuit as an electric current.

In this system, however, there is a drawback as follows. That is to say, the light absorption layer 15 is made of n− type InGaAs, whose wavelength at its absorption edge is 1.67 µm. Such a light having a wave length 1.67 µm at its absorption edge does not cause any problem to the light having a wavelength of 1.3 µm or 1.55 µm, which is used for transmitting of information in the optical communication. Since the light having a wave length of 1.65 µm, which is used for monitoring the Rayleigh scattered light, is close to the wavelength at the absorption edge of the light absorption layer 15, the sensitivity of the light used for the monitoring becomes low and the quantum effectivity thereof becomes about 20%.

FIG. 2 is a cross section showing the construction of another type of APD. The APD has its construction that on a substrate 1 made of n+ type InP are grown a buffer layer 2 made of n type InP and a crystal layer. The crystal layer is composed of a superlattice light absorption layer 16 made of n− type InAs/GaAs having a thickness of 1.5 to 2 µm, a layer 4 made of n− type InGaAs having a thickness of 0.1 µm, a multiplication layer 5 made of n+ type InP having a thickness of 1.5 µm, and a layer 8 made of p+ type InP having a thickness of 1 µm, in this order. On the surface of the crystal layer, a mesa etching is applied; a p type side electrode made of TiPtAu is provided and an n type side electrode made of AuGeNi to complete the photo detector. According to this APD, it is possible to make the wavelength at the absorption edge of the light absorption layer greater to 3.2 µm, since a superlattice layer structure of InAs and GaAs is used.

However, this ADP still has a drawback in that since the superlattice structure of InAs and GaAs is formed on InP, a lattice mismatching is generated on the phase boundary therebetween, so that a dark current is generated by the lattice imperfection; since the dark current causes noise, the sensitivity of the monitoring becomes low.

SUMMARY OF THE INVENTION

In order to solve the above mentioned drawback, the semiconductor photo detector according to the present invention has a first aspect in that the photo detector comprises:

a substrate made of Inp having a first conductivity;

a light absorption layer having a superlattice structure being made of InGaAs having the first conductivity and InAsP having the first conductivity;

a multiplication layer made of InP having the first conductivity;

a layer made of InP having a second conductivity, which is opposite to said first conductivity;

a first electrode for said first conductivity side being formed on said substrate made of InP having the first conductivity; and a second electrode for said second conductivity side being formed on said layer made of Inp having the second conductivity.

3

Further, the semiconductor photo detector according to the present invention has a second aspect in that the photo detector comprises:

a substrate made of Inp having a first conductivity;

a light absorption layer having a superlattice structure being made of InGaAs having the first conductivity and of InAsP having a first conductivity;

a multiplication layer made of InP having the first conductivity;

a window layer made of InP having the first conductivity;

a region having a second conductivity, which is opposite to said first conductivity, being formed in said window region;

a first electrode for said first conductivity side being formed on said substrate made of InP having the first conductivity; and a second electrode for said second conductivity side being formed on said region having the second conductivity.

DETAILED EXPLANATION OF PREFERRED EMBODIMENTS

Preferred embodiments of the present invention will be explained below, referring to the attached drawings.

Figure 1:
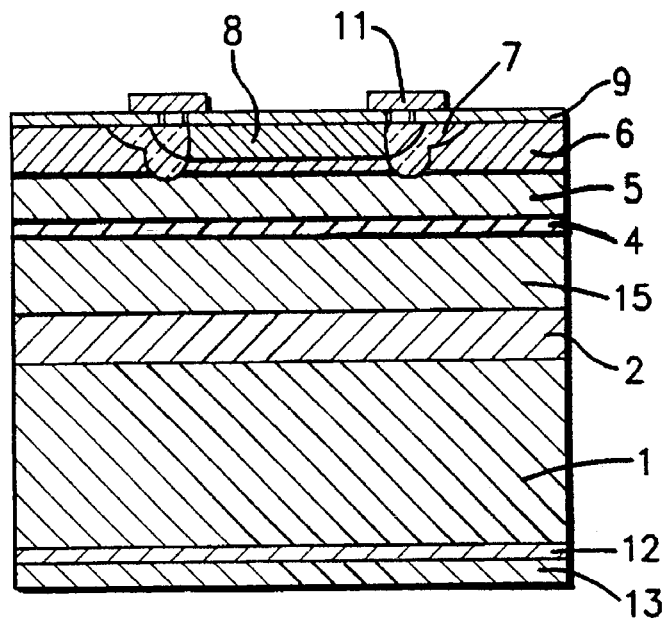
FIG. 1 is a cross sectional view showing a construction of semiconductor photo detector.
Figure 2:
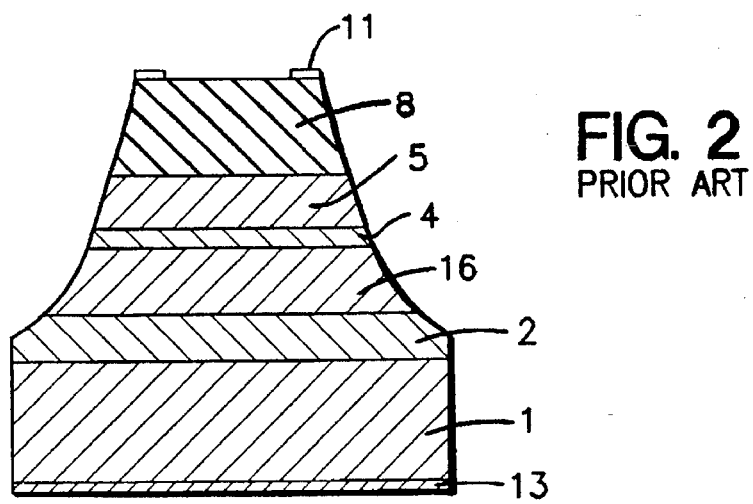
FIG. 2 is a cross sectional view representing a construction of the other conventional semiconductor photo detector.
Figure 3:
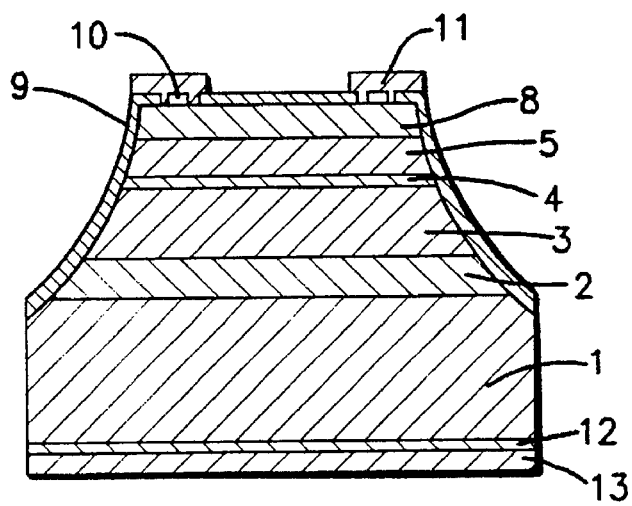
FIG. 3 is a cross sectional view depicting a construction of the semiconductor photo detector according to the first embodiment of the invention.

FIG. 3 is a cross sectional view showing a construction of a semiconductor photo detector according to a first embodiment of the present invention. As shown in FIG. 3, on a substrate 1, which is made of n+ type InP, are formed a buffer layer 2 made of n type InP having a carrier concentration of 1E15 $cm^{-3}$ and a thickness of 2 μm, a light absorption layer 3 having a superlattice structure made of n- type InGaAs/InAsP, used for absorbing long wavelength light, having a carrier concentration of 3E15$^{-3}$ and a thickness of 4 μm, an intermediate layer 4 made of n type InAsP having a carrier concentration of 1E16 $cm^{-3}$ and a thickness of 0.5 μm, a multiplication layer 5 made of n+ type InP having a carrier concentration 1E16 $cm^{-3}$ and a thickness 1.4 μm, and a layer 8 made of p+ type InP having a carrier concentration of 5E18 $cm^{-3}$ end a thickness of 1.4 μm, in this order, so as to form an epitaxial wafer. The epitaxial wafer is formed by a gas phase crystal growth method. The preferred carrier concentrations and the thicknesses thereof are: the carrier concentration of 1E15 to 2E16 $cm^{-3}$ and the thickness of 1 to 3 μm for the buffer layer 2, the carrier

4 concentration of 1E15 to 5E15 $cm^{-3}$ and the thickness of 3 to 4 μm for the superlattice light absorption layer 3, the carrier concentration of 3E15 to 1E16 $cm^{-3}$ and the thickness of 0.03 to 0.5 μm for the intermediate layer 4, the carrier concentration of 1E16 to 4E16 $cm^{-3}$ and the thickness of 0.5 to 3 μm for the multiplication layer 5, and the carrier concentration of 1E17 to 1E20 $cm^{-3}$ and the thickness of 1 to 2 μm for the p+ type InP layer 8.

On the front surface of the thus grown epitaxial wafer, a mesa etching is applied by, for instance, a chemical method, via an etching mask of 30 to 50 μm formed on the surface thereof. The etching mask can be formed by means of a photoresist technique. After, an insulation layer 9 is formed on the front surface by using a generally used method, a hole is then made within the insulation layer 9 so as to correspond to the p+ type InP layer 8. In the hole, is formed a p type side contact electrode 10 by, for instance, vacuum evaporation. Then, after the wafer is subjected to heat treatment, an p type side electrode 11 is formed so as to cover the contact electrode 10. Next, on the rear surface of the n type InP substrate 1, an n type side contact electrode 12 is formed by, for instance, vacuum evaporation, and then an n type side electrode 13 is formed so as to cover the contact electrode 12 after being subjected to heat treatment.

Figure 4:
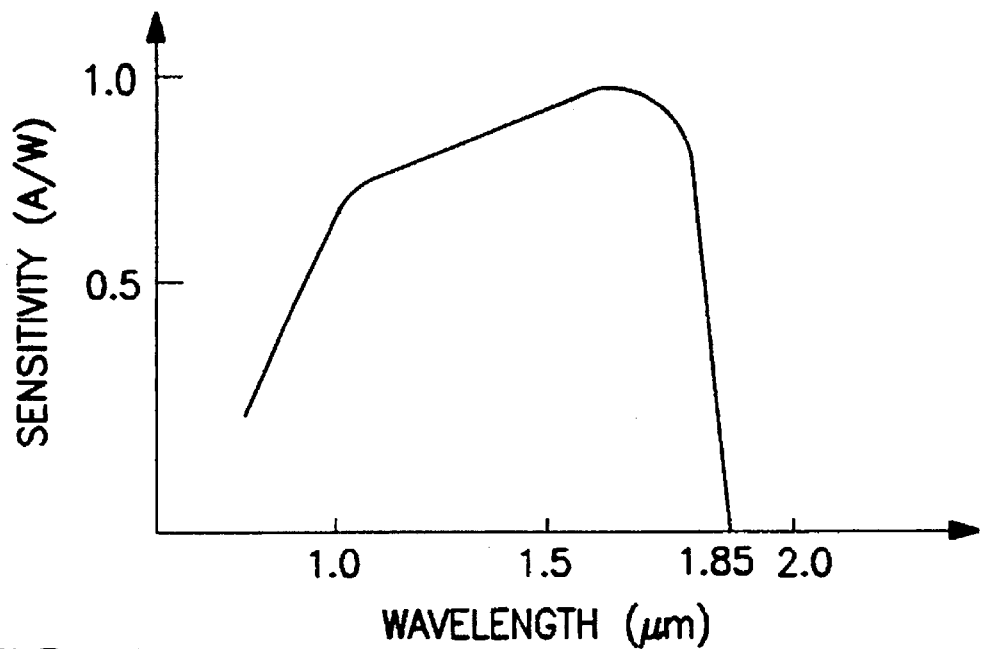
FIG. 4 is a graph illustrating a sensitivity distribution of the semiconductor photo detector according to the first embodiment of present invention.

FIG. 4 is a graph illustrating a spectral sensitivity characteristic of the thus obtained strained InGaAs/InAsP APD. When light having a wave length of 1.65 μm is made incident into the APD, the light is first made incident upon the p+ type InP layer 8, and then absorbed by the multiplication layer 5, the intermediate layer 4, and n– type InGaAs/InAsP superlattice light absorption layer 3, respectively. Carriers are generated by the thus absorbed light, and the carriers generated by the absorption are accelerated by an electric field applied between the p side electrode 11 and the n side electrode 13; the carriers then pass to the p side electrode 11, and the carriers are outputted to an external circuit as a photocurrent.

According to the construction of the above-mentioned APD, light having a wave length 1.65 μm is absorbed with a high effectivity, 75% or more. Further, a superlattice structure, where the InGaAs makes a lattice matching with InP and also the InAsP makes a lattice matching with InGaAs, is used for the light absorption layer, therefore the lattice mismatching is reduced. It is, therefore, possible to prevent that a dark current is caused by crystal imperfection, so that the dark current characteristic of 100 nA or less can be obtained. Further, since the dark current is reduced, the multiplication constant of the carriers becomes high, 30 or more times of the generated carriers in the n– type InGaAs/InAsP superlattice light absorption layer 3 by the electric field applied to the n+ type InP multiplication layer 5.

The same effect as mentioned above can be obtained in the other epitaxial wafers which are obtained by the CVD method, the MCVD method, the MBE method, the ALE method, etc.

Figure 5:
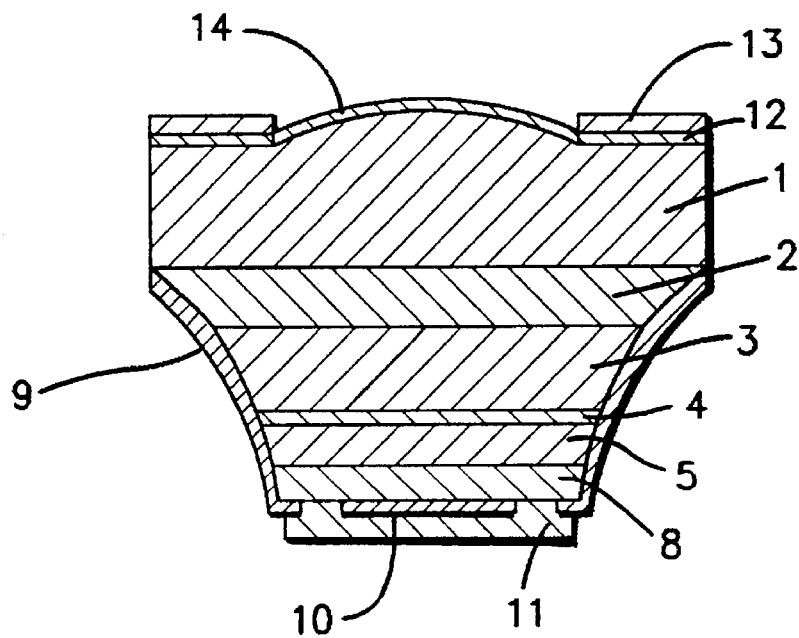
FIG. 5 is a cross sectional view illustrating a construction of the semiconductor photo detector according to the second embodiment of the present invention.

FIG. 5 is a cross sectional view showing a construction of a semiconductor light receiving element according to the second embodiment of the present invention. As shown in FIG. 5, on a substrate 1, which is made of n+ type InP, are formed a buffer layer 2 made of n type InP having a carrier concentration of 1E15 $cm^{-3}$ and a thickness of 2 μm, a light absorption layer 3 having a superlattice structure made of n– type InGaAs/InAsP, used for absorbing long wavelength light, having a carrier concentration of 3E15$^{-3}$ and a thickness of 4 μm, an intermediate layer 4 made of n type InAsP having a carrier concentration of 1E16 $cm^{-3}$ and a thickness of 0.5 μm, a multiplication layer 5 made of n+ type InP having a carrier concentration 1E16 $cm^{-3}$ and a thickness 1.4 μm, and a layer 8 made of p+ type InP having a carrier concentration of 5E18 $cm^{-3}$ and a thickness of 1.4 μm, in this order, so as to form an epitaxial wafer. The epitaxial wafer is formed by a gas phase crystal growth method. The preferred carrier concentrations and the thicknesses thereof are: the carrier concentration of 1E15 to 2E16 $cm^{-3}$ and the thickness of 1 to 3 μm for the buffer layer 2, the carrier concentration of 1E15 to 5E15 $cm^{-3}$ and the thickness of 3 to 4 μm for the superlattice light absorption layer 3, the carrier concentration of 3E15 to 1E16 $cm^{-3}$ and the thickness of 0.03 to 0.5 μm for the intermediate layer 4, the carrier concentration of 1E16 to 4E16 $cm^{-3}$ and the thickness of 0.5 to 3 μm for the multiplication layer 5, and the carrier concentration of 1E17 to 1E20 $cm^{-3}$ and the thickness of 1 to 2 μm for the p+ type InP layer 8.

On the front surface of the thus grown epitaxial wafer, a mesa etching is applied by, for instance, a chemical method, via an etching mask of 30 to 50 μm formed on the surface thereof. The etching mask can be formed by means of a photoresist technique. After, an insulation layer 9 is formed on the front surface side by using a generally used method, a hole is then made within the insulation layer 9 so as to correspond the p+ type InP layer 8. In the hole, is formed a p type side contact electrode 10 by, for instance, vacuum evaporation. Then, after the wafer is subjected to a heat treatment, a p type side electrode 11 is formed so as to cover the contact electrode 10.

Next, on the rear surface of the n+ type InP substrate 1, is formed a convex portion having a radius of 120 to 150 μm providing a lens on the rear side surface of the substrate by chemical etching; a lens coating 14 is further provided on the surface of the lens portion. An n type side contact electrode 12 is then formed on the rear surface of the n+ type InP substrate 1 so as to surround the lens portion by, for instance, vacuum evaporation. An n type side electrode 13 is then formed so as to cover the n type side contact electrode 12, after being subjected to heat treatment.

When light having a wave length of 1.65 μm is made incident into the thus obtained strained InGaAs/InAsP APD, the light is made incident upon the rear surface thereof and then introduced into the n+ type InP substrate 1 and the n type InP buffer layer 2 via the lens portion; the light is then absorbed in the n– type InGaAs/InAsP superlattice light absorption layer 3. The carriers generated by the thus absorbed light in the light absorption layer are flowed from the p type side electrode 11 into an external circuit via the n type InGaAsP intermediate layer 4, n+ type InP multiplication layer 5 and p+ type InP layer 8.

According to the construction of the second embodiment, light having a wave length 1.65 μm is absorbed with a high effectivity, 75% or more. Further, a superlattice structure, where the InGaAs makes a lattice matching with InP and the InAsP also makes a lattice matching with InGaAs, is used for the light absorption layer, therefore lattice mismatching is reduced. It is, therefore, possible to prevent that a dark current is caused by crystal imperfection, so that the dark current characteristic of 100 nA or less can be obtained. Further, since the dark current is reduced, the multiplication constant of the carriers becomes high, 30 or more times of the generated carrier in the n– type InGaAs/InAsP superlattice light absorption layer 3, by the electric field applied to the n+ type InP multiplication layer 5.

The same effect as mentioned above can also be obtained in the other epitaxial wafers which are obtained by the CVD method, the MCVD method, the MBE method, the ALE method, etc.

Figure 6:
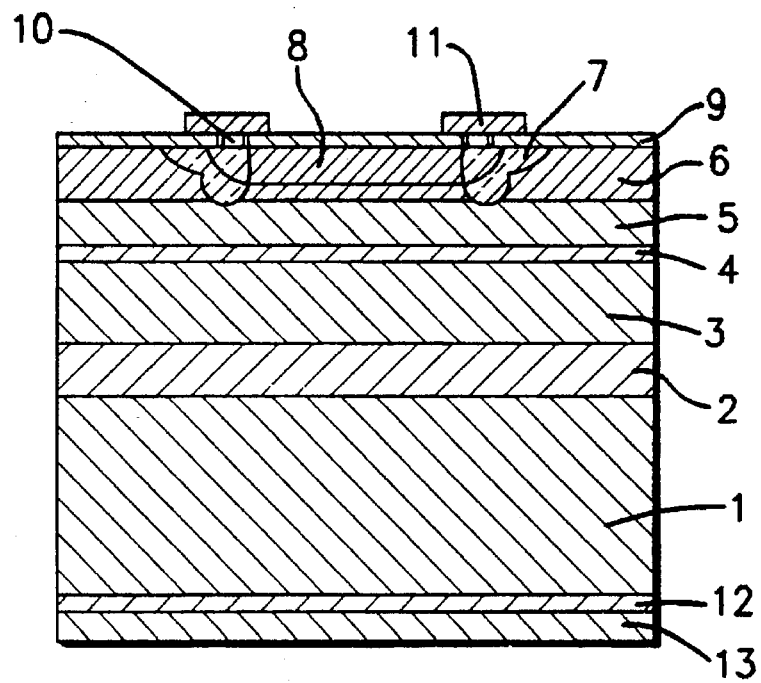
FIG. 6 is a cross sectional view representing a construction of the semiconductor photo detector according to the third embodiment of present invention.

FIG. 6 is a cross sectional view showing a construction of a semiconductor photo detector according to the third embodiment of the present invention. As shown in FIG. 6, on a substrate 1, which is made of n+ type InP, are formed a buffer layer 2 made of n type InP having a carrier concentration of 1E15 $cm^{-3}$ and a thickness of 2 μm, a light absorption layer 3 having a superlattice structure made of n– type InGaAs/InAsP, used for absorbing long wavelength light, having a carrier concentration of 3E15$^{-3}$ and a thickness of 4 μm, an intermediate layer 4 made of n type InAsP having a carrier concentration of 1E16 $cm^{-3}$ and a thickness of 0.5 μm, a multiplication layer 5 made of n+ type InP having a carrier concentration of 1E16 $cm^{-3}$ and a thickness 1.4 μm, and a window layer 6 made of n– type InP having a carrier concentration of 5E18 $cm^{-3}$ and a thickness of 1.4 μm, in this order, so as to form an epitaxial wafer.

The epitaxial wafer is formed by a gas phase crystal growth method. The preferred carrier concentrations and the thicknesses thereof are: the carrier concentration of 1E15 to 2E16 $cm^{-3}$ and the thickness of 1 to 3 μm for the buffer layer 2, the carrier concentration of 1E15 to 5E15 $cm^{-3}$ and the thickness of 3 to 4 μm for the superlattice light absorption layer 3, the carrier concentration of 3E15 to 1E16 $cm^{-3}$ and the thickness of 0.03 to 0.5 μm for the intermediate layer 4, the carrier concentration of 1E16 to 4E16 $cm^{-3}$ and the thickness of 0.5 to 3 μm for the multiplication layer 5, and the carrier concentration of 1E17 to 1E20 $cm^{-3}$ and the thickness of 1 to 2 μm for the n– type InP window layer 6.

On the front surfaces of the thus grown epitaxial wafer, a mask is formed by CVD (chemical vapor deposition) method, and a guard ring 7 is formed by ion implantation of Be. A window is then made in the diffusion mask so as to be superimposed on the guard ring 7; a p+ type InP layer 8 having a carrier concentration of 1E17 to 1E20 $cm^{-3}$, which corresponds to a light receiving portion, is selectively formed by a diffusion of Zn in a closed tube. Thereafter, an insulation layer 9 is formed on the front surface of the wafer by a generally used method. A hole is then made within the insulation layer 9, which is formed on the p+type InP layer 8. In the hole, is formed a p type side contact electrode 10 by, for instance, vacuum evaporation, and then the wafer is subjected to heat treatment. A p type side electrode 11 is then formed so as to cover the p type side contact electrode 10.

Next, on the rear surface of the n type InP substrate 1, is formed an n type side contact electrode 12 by, for instance, vacuum evaporation. An n type side electrode 13 is then formed so as to cover the n type side contact electrode 12, after being subjected to heat treatment.

When light having a wave length of 1.65 μm is made incident into the thus obtained strained InGaAs/InAsP APD, the light is made incident upon the p+ type InP layer 8, and then absorbed in the multiplication layer 5, the intermediate layer 4 and in the n– type InGaAs/InAsP superlattice light absorption layer 3, respectively. Carriers are generated by the thus absorbed light, and the carriers generated by the absorption are accelerated by an electric field applied between the p type side electrode 11 and the n type side electrode 13; the carriers are then flowed to the p type side electrode 11 and outputted to an external circuit as a photocurrent.

According to the construction of the third embodiment, light having a wave length 1.65 μm is absorbed with a high effectivity, 75% or more. Further, a superlattice structure, where the InGaAs makes a lattice matching InP and the InAsP also makes a lattice matching InGaAs, is used for the light absorption layer, therefore lattice mismatching is reduced. It is therefore, possible to prevent that a dark current is caused by crystal imperfection, so that the dark Current characteristic of 100 nA or less can be obtained. Further, since the dark current is reduced, the multiplication constant of the carriers becomes high, 30 or more times of the generated carriers in the n– type InGaAs/InAsP superlattice light absorption layer 3 by the electric field applied to the n+ type InP multiplication layer 5.

The same effect as mentioned above can also be obtained in the other epitaxial wafers which are obtained by the CVD method, the MCVD method, the MBE method, the ALE method, etc.

Figure 7:
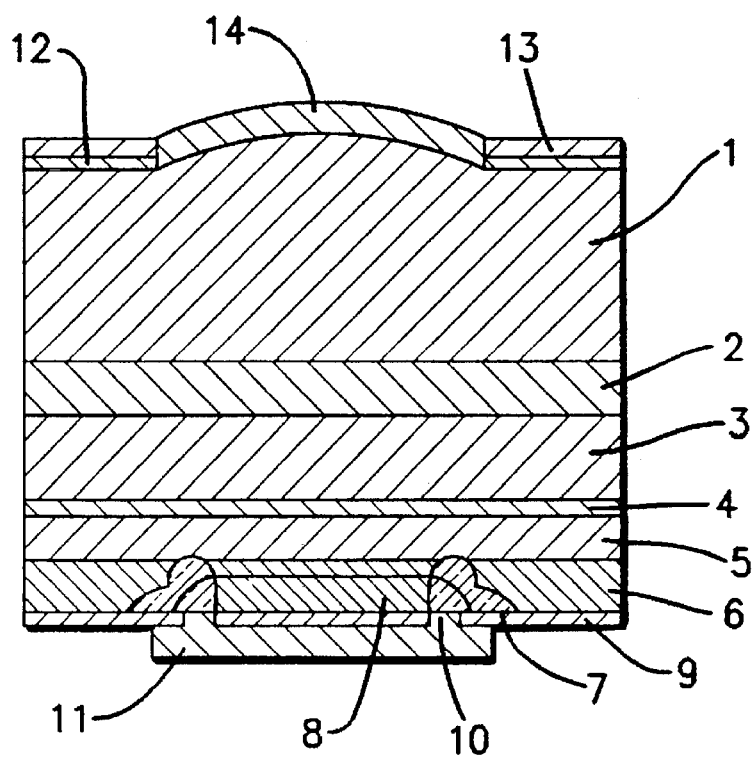
FIG. 7 is a cross sectional view showing a construction of the semiconductor photo detector according to the fourth embodiment of the present invention.

FIG. 7 is a cross sectional view showing a construction of a semiconductor photo detector according to the fourth embodiment of the present invention. As shown in FIG. 7, on a substrate 1 made of n+ type InP, are formed a buffer layer 2 made of n type InP having a carrier concentration of 1E15 $cm^{-3}$ and a thickness of 2 μm, a light absorption layer 3 having a superlattice structure made of n– type InGaAs/InAsP, used for absorbing long wavelength light, having a carrier concentration of $3E15^{-3}$ and a thickness of 4 μm, an intermediate layer 4 made of n type InAsP having a carrier concentration of 1E16 $cm^{-3}$ and a thickness of 0.5 μm, a multiplication layer 5 made of n+ type InP having a carrier concentration of 1E16 $cm^{-3}$ and a thickness 1.4 μm, end a window layer 6 made of n– type InP having a carrier concentration of 5E18 $cm^{-3}$ and a thickness of 1.4 μm, in this order, so as to form an epitaxial wafer.

The epitaxial wafer is formed by a gas phase crystal growth method. The preferred carrier concentrations and the thicknesses thereof are: the carrier concentration of 1E15 to 2E16 $cm^{-3}$ and the thickness of 1 to 3 μm for the buffer layer 2, the carrier concentration of 1E15 to 5 E15 $cm^{-3}$ and the thickness of 3 to 4 μm for the superlattice light absorption layer 3, the carrier concentration of 3E15 to 1E16 $cm^{-3}$ and the thickness of 0.03 to 0.5 μm for the intermediate layer 4, the carrier concentration of 1E16 to 4E16 $cm^{-3}$ and the thickness of 0.5 to 3 μm for the multiplication layer 5, and the carrier concentration of 1E17 to 1E20 $cm^{-3}$ and the thickness of 1 to 2 μm for the n– type InP window layer 6.

On the front surface of the thus grown epitaxial wafer, a mask is formed by a CVD (chemical vapor deposition) method, and a guard ring 7 is formed by, for instance, ion implantation of A window is then made in the diffusion mask so as to be superimposed on the guard ring 7; a p+ type InP layer 8 having a carrier concentration of 1E17 to 1E20 $cm^{-3}$, corresponding to a light receiving portion, is selectively formed therein by a diffusion in a closed tube. Thereafter, an insulation layer 9 is formed on the front surface by a commonly used method. A hole is then made within the insulation layer 9, which is formed on the p+ type InP layer 8. In the hole, is formed a p type side contact electrode 10 by, for instance, vacuum evaporation, and the wafer is then subjected to heat treatment. A p type side electrode 11 is then formed so as to cover the p type side contact electrode 10.

Next, on the rear surface of the n+ type InP substrate 1, is formed a convex portion having a radius of 120 to 150 μm providing a lens on the rear surface of the substrate by chemical etching; a lens coating 14 is further provided on the surface of the lens portion. An n type side Contact electrode 12 is then formed on the rear surface of the n+ type InP substrate 1 so as to surround the lens portion by, for instance, vacuum evaporation. An n type side electrode 13 is then formed so as to cover the n type side contact electrode 12, after being subjected to heat treatment.

When light having a wave length of 1.65 μm is made incident into the thus obtained strained InGaAs/InAsP APD, light is made incident upon the rear surface thereof, and introduced into the n+ type InP substrate 1 and the n type InP buffer layer 2 via the lens portion; the light is then absorbed in the n-type InGaAs/InAsP superlattice light absorption layer 3. The carriers generated by the absorption in the light absorption layer are flowed from the p type side electrode 11 into an external circuit via the n type InGaAsP intermediate layer 4, n+ type InP multiplication layer 5 and p+ type InP layer 8.

According to the construction of the fourth embodiment, light having a wave length of 1.65 μm is absorbed with a high effectivity, 75% or more. Further, a superlattice structure, where the InGaAs makes a lattice matching to InP and the InAsP makes a lattice matching to InGaAs, is used for the light absorption layer, therefore lattice mismatching is reduced. It is, therefore, possible to prevent that a dark current is caused by crystal imperfection, so that the dark current characteristic of 100 nA or less can be obtained. Further, since the dark current is reduced, the multiplication constant of the carriers becomes high, 30 or more times of the generated carriers in the n– type InGaAs/InAsP superlattice light absorption layer 3 by the electric field applied to the n+ type InP multiplication layer 5.

The same effect as mentioned above can also be obtained in the other epitaxial wafers which are obtained by the CVD method, the MCVD method, the MBE method, the ALE method, etc.

It should be noted that it is preferred the composition of the light absorption layer 3 is selected so that the sensitivity for the light having a wavelength of 1.65 μm becomes high.

As explained above, according to the present invention, light having a wave length of 1.65 μm is absorbed in the n– type InGaAs/InAsP superlattice light absorption layer with a high efficiency, i.e. 75% or more. Further, since the lattice mismatching may be reduced, low dark current characteristic of 100 nA or less may be obtained. Furthermore, the multiplication constant of the carriers becomes high, 30 or more times of the generated in the n– type InGaAs/InAsP superlattice light absorption layer by the electric field applied to the n+ InP multiplication layer.

What is claimed is:

1. A semiconductor photo detector comprising:

a substrate made of InP having a first conductivity;

a light absorption layer having a superlattice structure being made of InGaAs having the first conductivity and InAsP having the first conductivity;

a multiplication layer made of InP having the first conductivity;

a layer made of InP having a second conductivity, which is opposite to said first conductivity;

a first electrode for said first conductivity side being formed on said substrate made of Inp having the first conductivity; and a second electrode for said second conductivity side being formed on said layer made of Inp having the second conductivity.

2. A semiconductor photo detector comprising:

a substrate made of Inp having a first conductivity;

a light absorption layer having a superlattice structure being made of InGaAs having the first conductivity and of InAsP having a first conductivity;

a multiplication layer made of InP having the first conductivity;

a window layer made of InP having the first conductivity;

a region having a second conductivity, which is opposite to said first conductivity, being formed in said window region;

a first electrode for said first conductivity side being formed on said substrate made of InP having the first conductivity; and a second electrode for said second conductivity side being formed on said region having the second conductivity.

3. A semiconductor photo detector according to claim 1, wherein said photo detector is arranged as a mesa type photo detector.

4. A semiconductor photo detector according to claim 1, wherein said InP substrate comprises a lens portion at a light incident side thereof.

5. A semiconductor photo detector according to claim 2, wherein a guard ring is provided in said window region and said region having the second conductivity is formed in said guard ring.

6. A semiconductor photo detector according to claim 2, wherein said InP substrate comprises a lens portion at a light incident side thereof.

* * * * *